(12) United States Patent
Staszewski et al.

(10) Patent No.: US 7,767,995 B2
(45) Date of Patent: Aug. 3, 2010

(54) SINGLE-ELECTRON TUNNEL JUNCTION FOR COMPLEMENTARY METAL-OXIDE DEVICE AND METHOD OF MANUFACTURING THE SAME

(75) Inventors: Robert B. Staszewski, Garland, TX (US); Renaldi Winoto, Albany, CA (US); Dirk Leipold, Igis (CH)

(73) Assignee: Texas Instruments Incorporated, Dallas, TX (US)

( * ) Notice: Subject to any disclaimer, the term of this patent is extended or adjusted under 35 U.S.C. 154(b) by 67 days.

(21) Appl. No.: 11/846,993

(22) Filed: Aug. 29, 2007

(65) Prior Publication Data

US 2008/0054253 A1 Mar. 6, 2008

Related U.S. Application Data

(60) Provisional application No. 60/823,787, filed on Aug. 29, 2006.

(51) Int. Cl.
*H01L 29/06* (2006.01)

(52) U.S. Cl. .............. 257/9; 257/23; 257/104; 257/E39.013; 977/937; 438/590; 438/979

(58) Field of Classification Search .............. 257/9, 257/29, 30, 10–27, 104–106; 977/937; 438/2, 438/590, 979, 983
See application file for complete search history.

(56) References Cited

U.S. PATENT DOCUMENTS 5,972,744 A * 10/1999 Morimoto et al. .......... 438/197
6,060,748 A * 5/2000 Uchida et al. .............. 257/347

* cited by examiner

*Primary Examiner*—Evan Pert
*Assistant Examiner*—Scott R Wilson
(74) *Attorney, Agent, or Firm*—John J. Patti; Wade J. Brady, III; Frederick J. Telecky, Jr.

(57) ABSTRACT

A method of providing a p-type substrate, disposing a pad oxide layer on the p-type substrate, disposing a nitride layer on the pad oxide layer, forming a nitride window in the nitride layer, disposing a field oxide in the nitride window, disposing a polysilicon gate over the field oxide, and diffusing a n-doped region in the p-type substrate, thereby forming at least one single-electron tunnel junction between the polysilicon gate and the n-doped region.

20 Claims, 7 Drawing Sheets

SINGLE-ELECTRON TUNNEL JUNCTION FOR COMPLEMENTARY METAL-OXIDE DEVICE AND METHOD OF MANUFACTURING THE SAME

CROSS-REFERENCE TO RELATED APPLICATIONS

This application is based on and claims the benefit of U.S. Provisional Application Ser. No. 60/823,787 filed on Aug. 29, 2006, entitled "Self-Synchronization of Oscillators with Single-Electron Restoration," commonly assigned with this application and incorporated herein by reference in its entirety, and is related to application Ser. No. 11/846,987, entitled "Single-Electron Injection/Extraction Device for a Resonant Tank Circuit and Method of Operation Thereof" and is also related to application Ser. No. 11/847,008, entitled "A Parallel Redundant Single-Electron Device and Method of Manufacture", both to be filed concurrently herewith.

TECHNICAL FIELD

The disclosure is directed, in general, to single-electron tunnel junction, and more specifically, to a single-electron tunnel junction and its method of manufacture in an integrated circuit using complementary metal-oxide semiconductor (CMOS) processes.

BACKGROUND

A component of a single-electron circuit is a single-electron tunnel junction. Generally, a single-electron tunnel junction has a structure similar to a parallel plate capacitor, where two plates are separated by a dielectric. However, the single-electron tunnel junction has two special properties that sets it apart from an ordinary parallel plate capacitor. First, the dielectric has to be thin enough to allow an electrons to tunnel through the dielectric. Second, the capacitance of the structure should be sufficiently small so that the addition of a single electron would result in a significant voltage change (such as 0.5 volts).

To date, however, devices produced using conventional CMOS process have not produced satisfactory results. Thus, there is a need for a single-electron device made using conventional CMOS presses

SUMMARY

An aspect of the disclosure provides a method of manufacturing a single-electron tunnel junction device. The method includes: providing a p-type substrate, disposing a pad oxide layer on the p-type substrate, disposing a nitride layer on the pad oxide layer, forming a nitride window in the nitride layer, disposing a field oxide in the nitride window, disposing a polysilicon gate over the field oxide and diffusing a n-doped region in the p-type substrate, thereby forming at least one single-electron tunnel junction between the polysilicon gate and the n-doped region.

Another aspect of the disclosure includes a single-electron tunnel junction device. The single-electron tunnel junction device includes a p-type substrate, an n-doped region disposed in the p-type substrate, a pad oxide disposed over the n-doped region, a field oxide to a side of the n-doped region, and a polysilicon gate disposed over the field oxide and the pad oxide.

Another aspect of the disclosure includes a parallel array single-electron tunnel junction device. The parallel array single-electron tunnel junction device includes the above-described single-electron tunnel junction device. The parallel array single-electron tunnel junction device further includes a second single-electron tunnel junction including: the p-type substrate, a second n-doped region disposed on the p-type substrate, a second pad oxide disposed over the second n-doped region, a second polysilicon gate disposed over the second field oxide and said second pad oxide, wherein at least two of the parallel redundant single-electron tunnel devices have a differing capacitance as a function of a difference between: a) a first distance measured between the first n-doped region and the first polysilicon gate, and b) a second distance measured between the second n-doped region and the second polysilicon gate.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
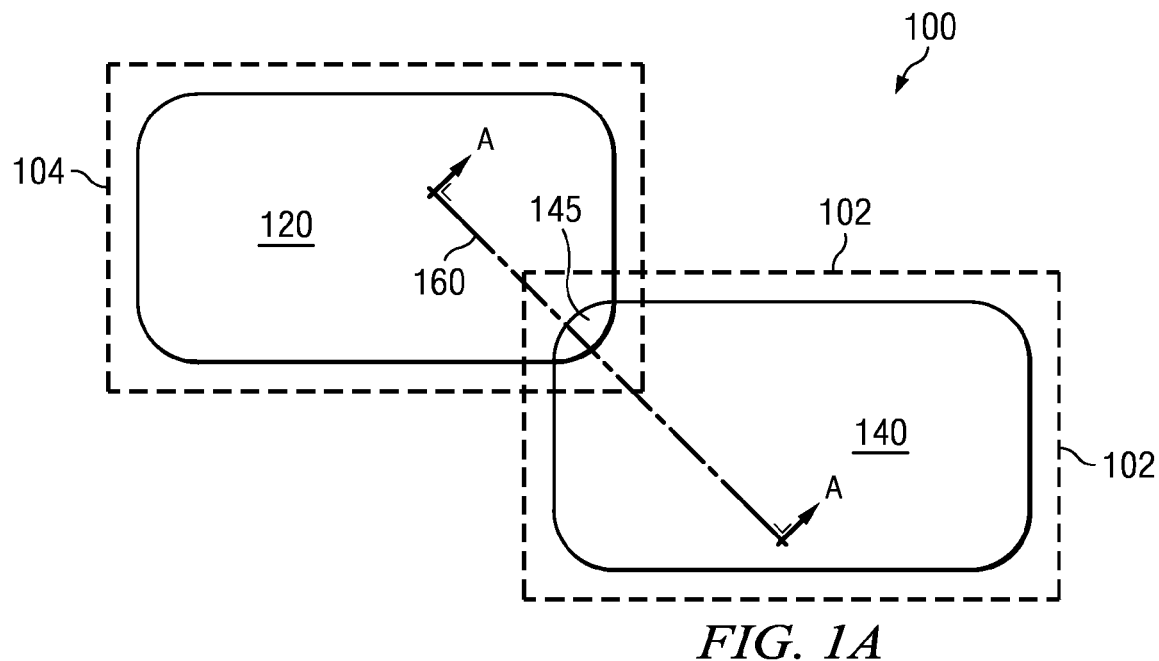
FIG. 1A illustrates a plan view of a portion of a single-electron device in accordance with a preferred embodiment of the present invention.

FIG. 1A illustrates a top view of a single-electron device 100 constructed in accordance with a preferred embodiment of the present invention. As can be seen in FIG. 1A, a first portion 102 and second portion 104 overlap one another. In particular, a single-electron tunnel junction 145 created from a layer of an n-doped region 120, an interposing pad oxide (not illustrated), and a polysilicon gate 140, similar to a parallel plate capacitor. Preferably, the n-doped region 120 is doped with arsenic or phosphorous, and the polysilicon gate is doped with boron. An overlap area or junction 145 between the n-doped region 120 and the polysilicon gate 140 should be small (on the order of 5-10 nm by 5-10 nm) so that the capacitance small (for example below 1 aF).

Such a design constraint creates problems when trying to manufacture single-electron tunnel junctions using standard CMOS fabrication techniques. Generally, ensuring that a sufficiently small capacitance is realized in a single-electron tunnel device can be a difficult challenge when fabricating the single-electron tunnel junction. For instance, if too large of a capacitance is created, then the voltage change resulting from the addition of a single-electron to the structure might not be differentiable from voltage fluctuation due to thermal noise. One alternative to reduce the capacitance of a parallel plate structure is to arbitrarily increase the thickness of the dielectric layer. However, increasing the thickness of the dielectric layer between region 120 and gate 140 would inhibit tunneling of electrons.

Figure 1B:
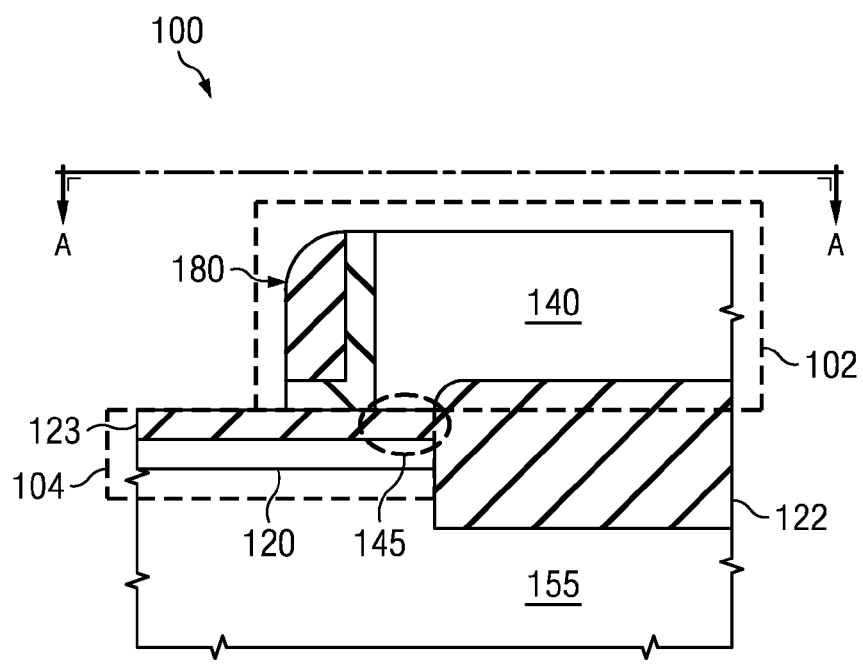
FIG. 1B illustrates a cross-sectional view of the single-electron device of FIG. 1A along line A-A.

Turning now to FIG. 1B, a cross-sectional view of the single-electron device 100 along line A-A can be seen. Underling the device 100 is a substrate 155, which is preferably a p-type substrate. The n-type region 120 is formed in or is disposed on the substrate. The substrate 155 also has a field oxide layer 122 disposed on and to a side of the substrate 155. A pad oxide layer 123 (which is generally a thin oxide layer) covers the n-doped region 120. The conductive gate 140 (which is generally comprised of polysilicon) overlies both the field oxide 122 and an overhang of the n-doped region 120 with the thin layer of pad oxide layer 123 interposed between. This creates the single-electron tunnel junction 145. In other words, the polysilicon gate 140, disposed over part of the thin layer of pad oxide layer 123, which is disposed over the n-doped region 120, forms a capacitor. A bracing area 180 can also be used to help support the structure of the polysilicon gate 140.

As an example, the single-electron tunnel junction 145 can be about a 5 nm by 5 nm area, giving rise to a capacitance of 0.3 aF. Since the charge of an electron is approximately $1.6 \times 10^{-19}$ C, an addition of a single electron would result in a voltage change of approximately 0.5V. For ease of explanation, any stray capacitance of the polysilicon gate 140 is assumed negligible. That is an example of acceptable single-electron tunnel junction or, which has good characteristics for measuring and exploiting single-electron effects. Additionally, 0.1 volts may be set as a threshold. Single-electron devices below this discernable threshold may be deemed unacceptable for single-electron effects. However, these voltage changes may be generally measurable above variations in background thermal noise. The thickness of the n-doped region 120 can also be about 90 nm with the thickness of the pad oxide layer 123 being about 1.2 nm. The capacitance of the single-electron tunnel junction 145 may also be sufficiently small such that the addition of a single electron to the structure would result in a voltage change that is substantially equal to 1V.

Figure 2:
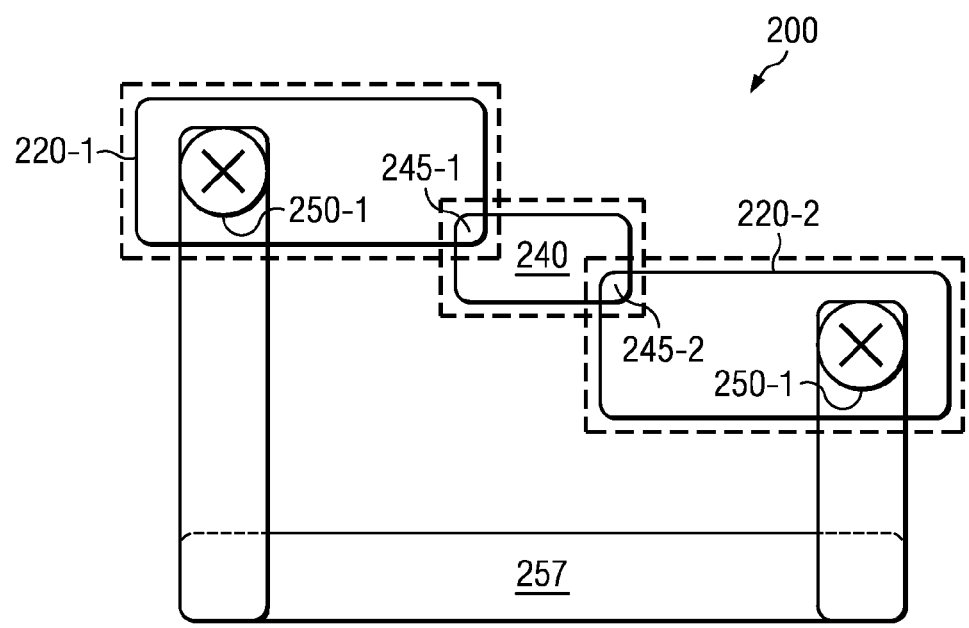
FIG. 2 illustrates a plan view of a single-electron device in accordance with a preferred embodiment of the present invention employing two tunnel junctions.

Turning to FIG. 2, an example of single-electron device 200 in accordance with a preferred embodiment of the present invention employing two tunnel junctions can be seen. In the device 200, n-doped regions 220-1 and 220-2 are both disposed under a polysilicon gate 240 with a thin layer of pad oxide (not illustrated) disposed in between (similar to device 100). Here, though, regions 220-1 and 220-2 are coupled together through metal contacts 250-1 and 250-2 and metal connection 257 so that the capacitance of the tunnel junction 245-1 compensates for a deficiency of a capacitance of tunnel junction 245-1. In other words, if the polysilicon gate 240 is misaligned with respect with its placement over the n-doped region 220-1 such that the capacitance of the tunnel junction 245-1 is too large or too small, then tunnel junction 245-2 compensates for it.

Generally, because a desired overlap between an n-doped region 220-1 and/or 220-2 and a polysilicon gate 240 is small, precise alignment between the n-doped region 220-1 and/or 220-2 and the polysilicon gate 240 is important. This means the alignment between a mask for placement of the n-doped region (active mask) and a polysilicon mask should be precise. If the active mask and the polysilicon masks are not precisely aligned, then excess capacitance might result, or no overlap region would result. For instance, for a desired 5 nm by 5 nm overlap, a standard deviation for mask alignment error of 5 nm in a 45 nm gate-length CMOS process generation, results in no gate overlap whatsoever. Device 200 can help alleviate this problem by, using the aggregate capacitance of both tunnel junctions 245-1 and 245-2 (which is substantially constant) if a small alignment offset exists between the polysilicon gate 240 and the n-doped region 220-1 or 220-2.

Based on the device 200, the smallest single-electron tunnel junction that can be fabricated, with a relatively high yield, can be estimated. Assuming a fabrication tool having a worst-case alignment offset of r radially between the n-doped region 220-1 and a mask for the polysilicon gate 240 is employed, the aggregate capacitance from tunnel junctions 245-1 and 245-2 can be made substantially constant for offsets that are not too "large," such as an offset of 5 nm.

Figure 3A:
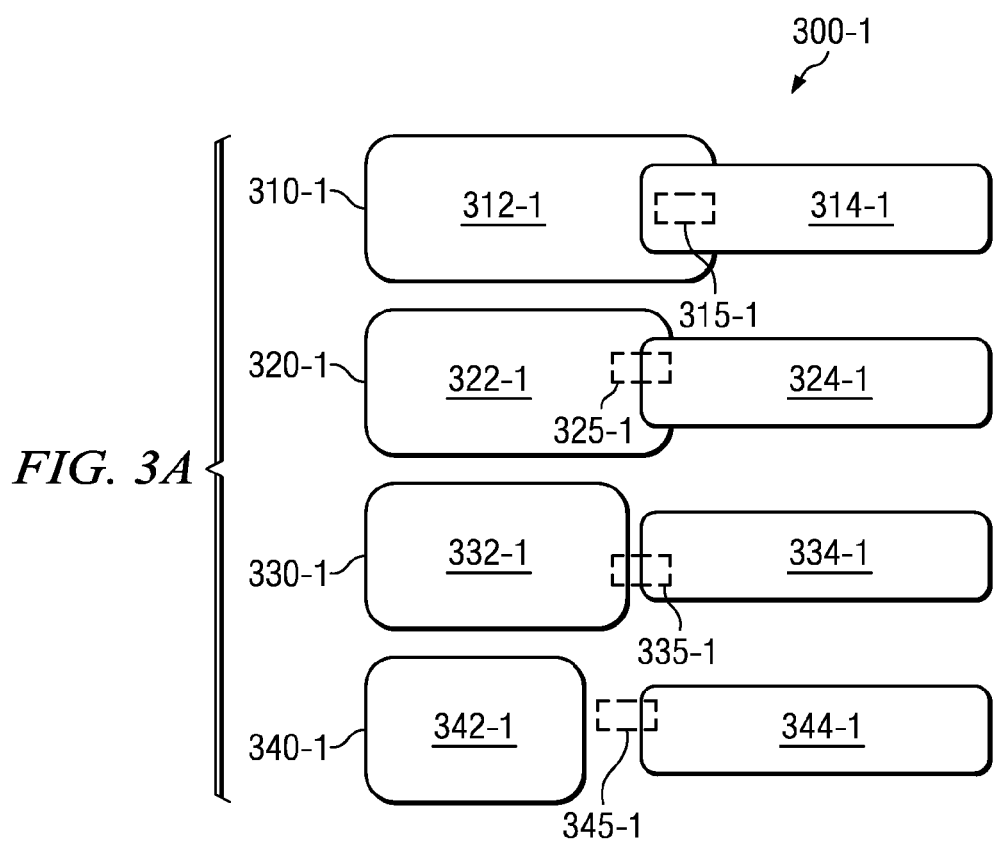
FIG. 3A illustrates a redundant array of single electron tunnel junction devices in accordance with a preferred embodiment of the present invention.

Due to the problems associated with forming such small tunnel junctions, it may be desirable to form parallel, redundant devices (such as device 100 or 200) to generally ensure high yield in a system, regardless of the reliability of individual devices (such as device 100 or 200). In FIG. 3A, an example of an array 300-1 of parallel, redundant devices 310-1, 320-1, 330-1, and 340-1 can be seen. As shown, offsets for the devices 310-1, 320-1, 330-1, and 340-1 are deliberately changed, where n-doped regions 312-1, 322-1, 332-1, and 342-1 and polysilicon gates 314-1, 324-1, 334-1, and 344-1 are placed at different offsets with respect to their tunnel junctions 315-1, 325-1, 335-1, and 345-1. Additionally, because the individual size of the tunnel junction 315-1, 325-1, 335-1, and 345-1 is small, manufacturing array 300-1 should not take a significant amount of area.

Generally, lithography and etching processes to manufacture MOS devices, such as single-electron tunnel junctions, are not completely error-free in the sense that a desired geometry would not appear exactly the same on fabricated silicon. This is especially true wherein the minimum feature sizes of the MOS and CMOS devices are already much smaller than the ultra-violet light wavelength used to define them in the lithography process. This creates limitations on a CMOS fabrication system. One prevalent effect associated with this limitation is that square edges are rounded. Mask offset is also a problem, along with other variations in fabrication process. These other variations could be due to a non-uniform density of an etching solution or due to other imperfections in a lithography process in a standard CMOS process. Employment of the parallel array 300-1 could be employed in a plurality of situations in order to improve an overall yield by accounting for tunnel junctions that are smaller than alignment margins of the fabrication tools and accounting for random process variations.

As a result, generating the array 300-1 can help ensure that an acceptable tunnel junction is created somewhere in the redundant array 300-1. By deliberately varying the offset between the n-doped region 312-1, 322-1, 332-1, and 342-1 and the polysilicon gate 314-1, 324-1, 334-1, and 344-1 in the device layout, misalignment of masks of the polysilicon during the fabrication process can be rendered less critical, as one of the devices 310-1, 320-1, 330-1, and 340-1 would have an overlap that is closest to a desired overlap.

Figure 3B:
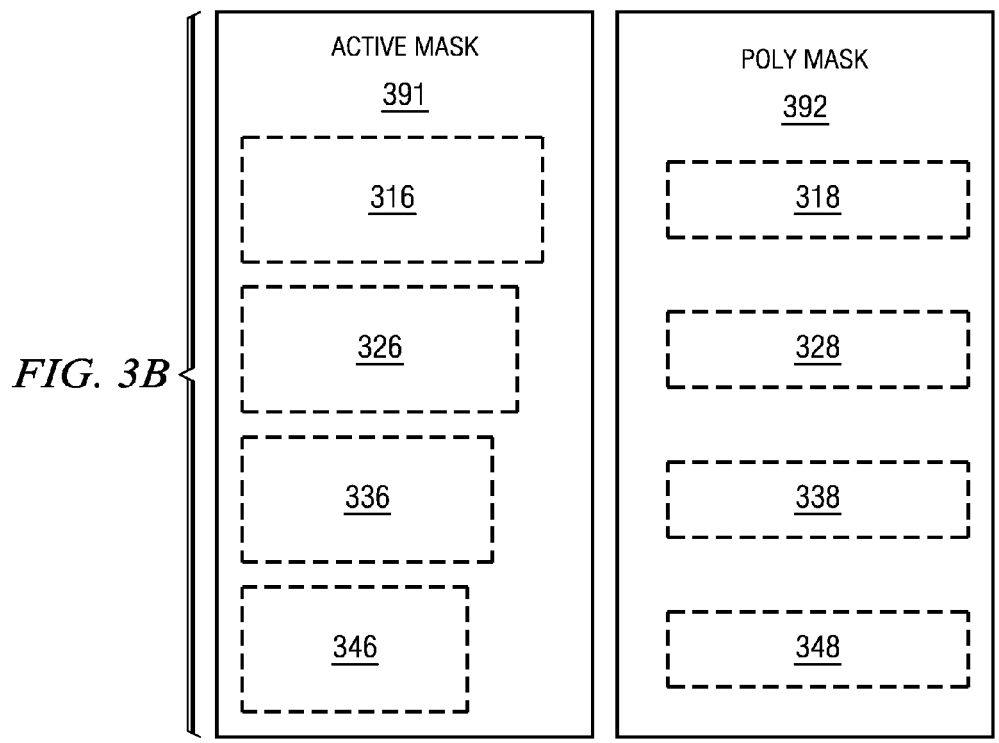
FIGS. 3B and 3C illustrate misalignments of an active mask and a polysilicon mask for producing the array of FIG. 3A.

Turning to FIG. 3B, the active mask 391 and the polysilicon mask 392 used to fabricate the array 300 can be seen. The exposed area 316, 326, 336, and 346 in the active mask 391 defines the resulting printed geometry of the n-doped region 312-1, 322-1, 332-1, and 342-1 respectively. Similarly, the exposed areas 318, 328, 338, and 348 in the polysilicon mask 392 are used to print the polysilicon structures 314-1, 324-1, 334-1, and 344-1 respectively. If the two masks 391 and 392 are aligned correctly and there are no other variations or errors, then the array 300-1 be produced.

Figure 3C:
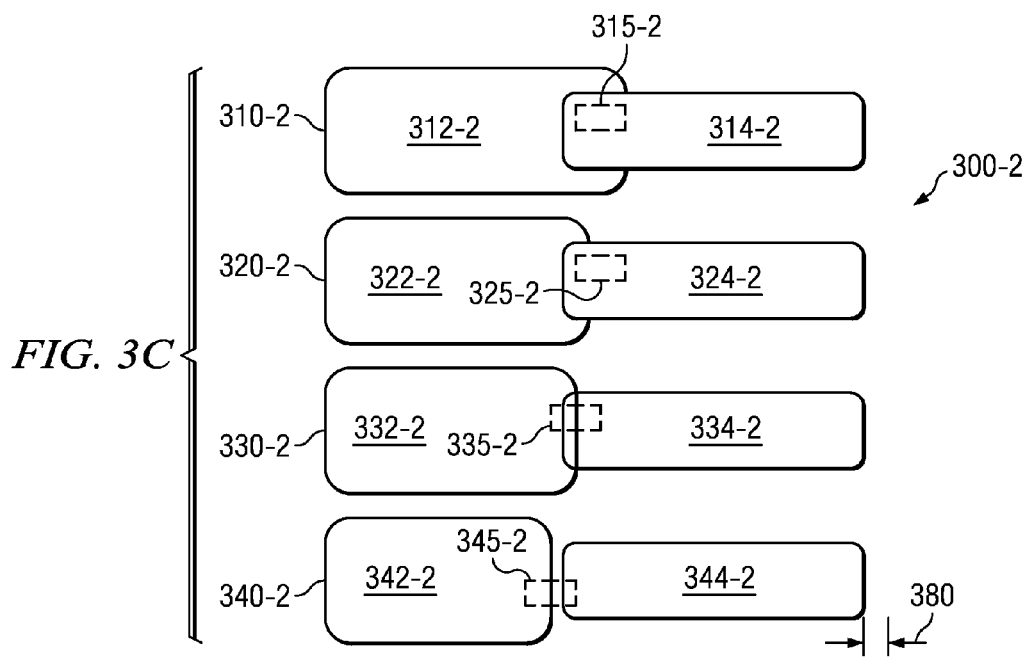

Process variations and other errors, though, are common, so, as can be seen in FIG. 3C, a typical array 300-2 can be seen. Here, polysilicon mask 392 is misaligned by a direction and amount indicated by reference numeral 380 relative to the active mask, resulting in a misalignment 380 for each of devices 310-2, 320-2, 330-2, and 340-2. As shown, tunnel junctions 315-2, 325-2, and 345-2 between regions 310-2, 320-2, 340-2 and gates 314-2, 324-2, 344-4 are unacceptable. However, tunnel junction 335-2 between region 332-2 and gate 334-2 is acceptable (instead of tunnel 320-1 of FIG. 3A).

Although fabrication techniques, through differing offsets, may lead to manufacturing yields wherein the number of single-electron devices that have acceptable effects may be relatively low for a given manufacturing run (e.g., 20.0%) it can be recognized that, through adapting CMOS manufacturing techniques, there is an efficiency in producing a high number of single-electron devices, and then selecting a subset of those high number single-electron devices that evince an acceptable single-electron effect (e.g., voltage change due to a single-electron that is discernable from thermal noise). Due to the relatively small chip area or "real estate" that the single-electron devices occupy, manufactures may generate, through varying offsets, a sufficient number of single-electron devices on a given chip.

Figure 4:
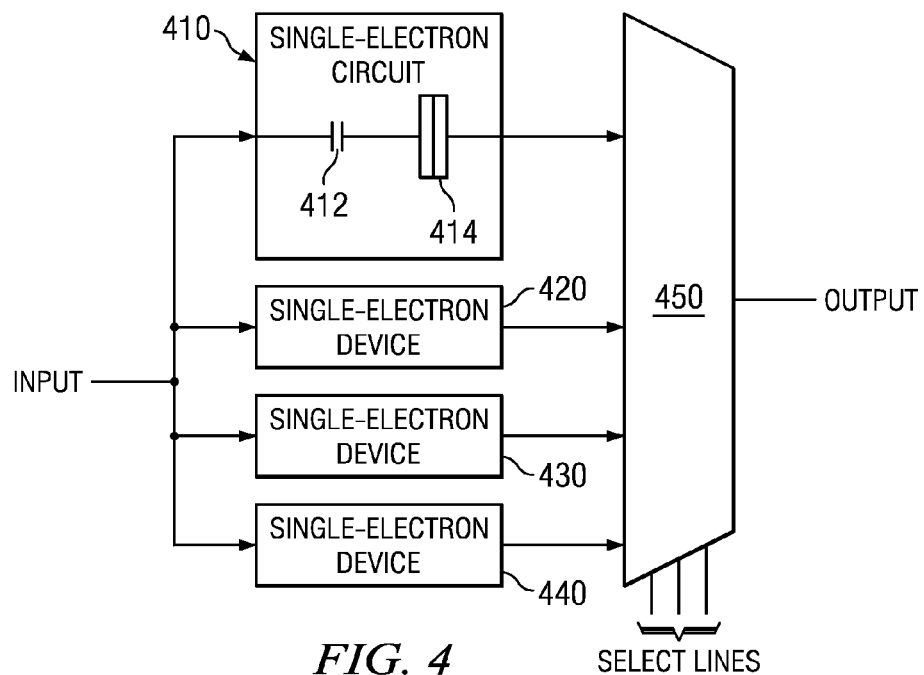
FIG. 4 illustrates a circuit for selecting a single-electron tunnel junction device from an array in accordance with a preferred embodiment of the present invention.

Turning to FIG. 4, a circuit 400 for selecting from one single-electron tunnel junction from an array can be seen. The single-electron tunnel devices 410, 420, 430 and 440 (which form an array) are coupled to a multiplexer or mux 450. Each single-electron tunnel device 410 through 440 can be selected by a select line in the mux 450. Therefore, a functional single-electron tunnel device (i.e., 410) can be selected. Note that the selection could be done by other means, such as selective of the input voltage to each of the single-electron devices. In that case the multiplexer 450 would not be a physical multiplexer as shown in FIG. 4, but a multiplexer mechanism, firmware or software with a variety of approaches to a specific realization of the physical selection. Each of the single electron devices may also have a different internal alignment offset and is selectable by the multiplexer 450. The number of the single-electron devices to be selected could be very high, even up to a million or more.

Each of the plurality of single-electron circuit 410, 420, 430, 440 (as shown, for example, in device 410) include a tunneling junction 414 coupled in series with a capacitor 412. In some cases, the capacitor 412 may be a "non-tunneling" capacitor; in other words, no appreciable tunneling effects occur between the plates of capacitor 412. The capacitor 412 can be fabricated by stacking a metal layer on top of the polysilicon gate 140. This type of structure, such as shown within single-electron device 410, is similar to a "Coulomb blockade".

Figure 5A:
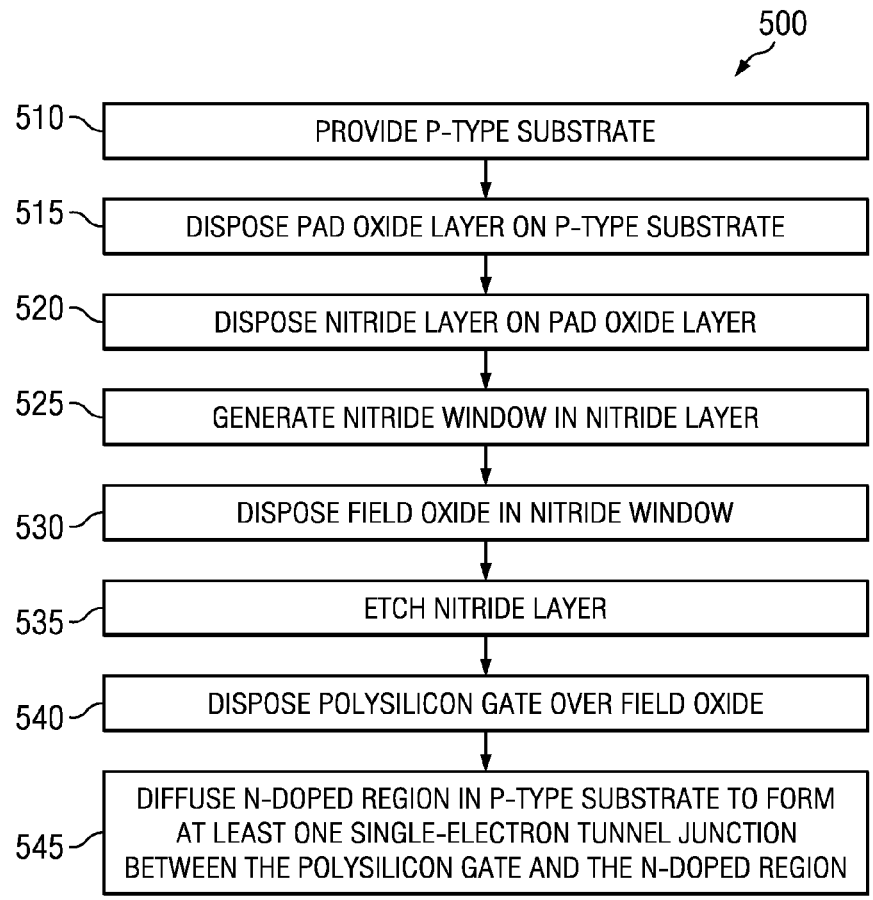
FIG. 5A illustrates a flow chart of a method of manufacturing a single-electron tunnel junction with CMOS processing in accordance with a preferred embodiment of the present invention.
Figure 6A:
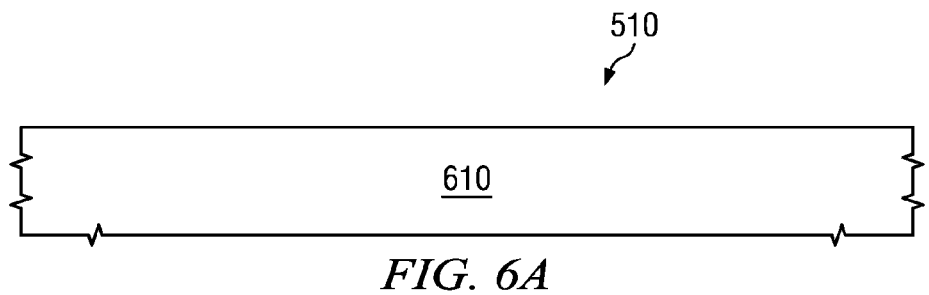
FIGS. 6A-6G illustrate cross-section views of process steps of FIG. 5A.
Figure 6B:
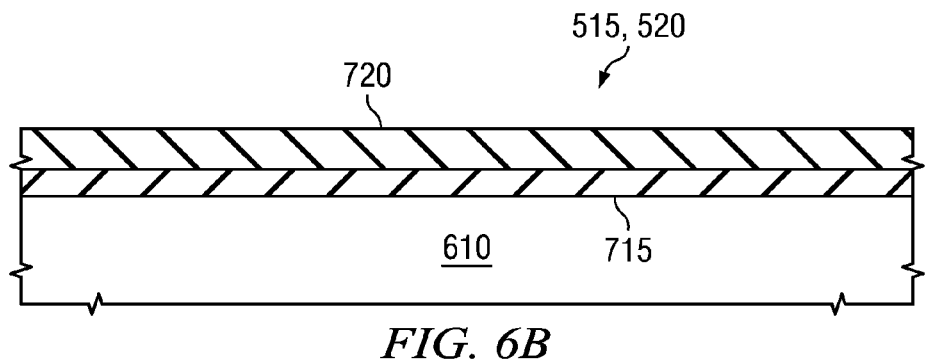
Figure 6C:
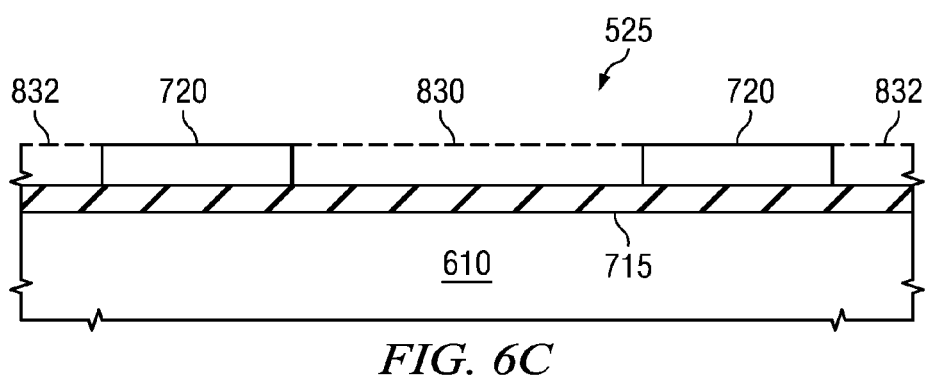
Figure 6D:
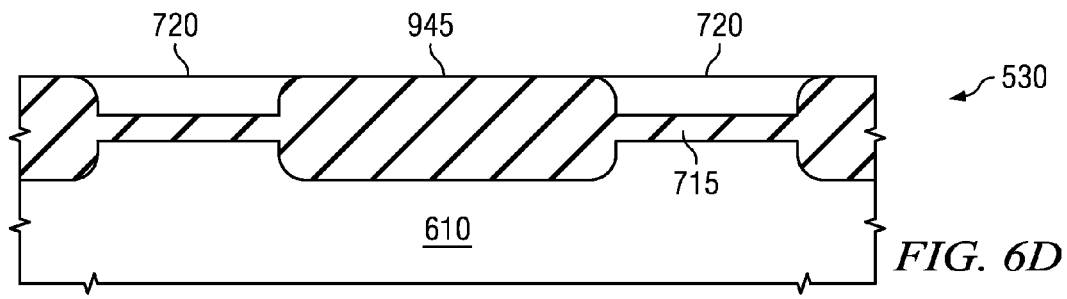
Figure 6E:
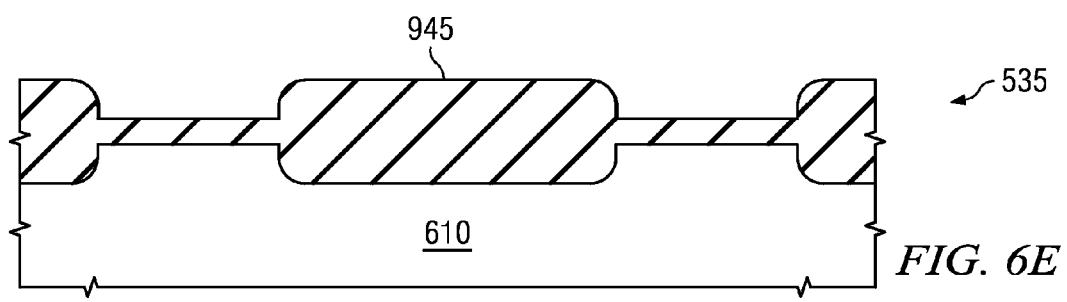
Figure 6F:
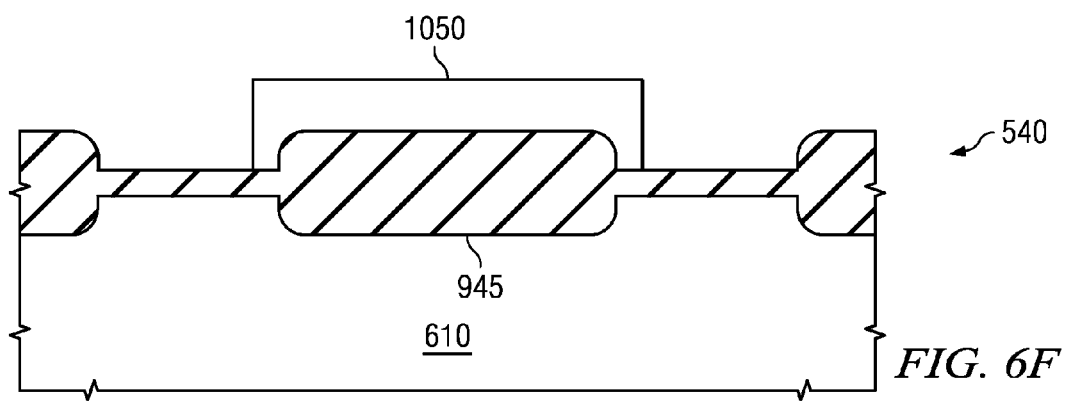
Figure 6G:
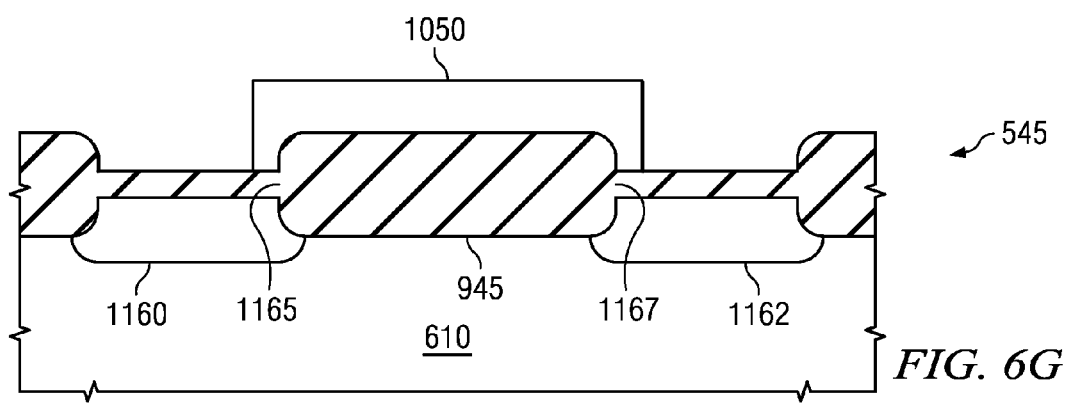

FIG. 5A illustrates a flow chart of a method of manufacturing a single-electron tunnel junction in a method 500 (such as devices 100 or 200) which correspond to the process steps of FIGS. 6A-6G. In a step 510 (as shown in FIG. 6A), a p-type substrate 610 is provided, which may be etched and processed. In a step 515 (as shown in FIG. 6B), a pad oxide layer 715 is disposed on the p-type substrate 610. At least part of the pad oxide layer 715 may also later be employed as the part of the field oxide layer 123 of FIG. 1B. In a step 520 (also as shown in FIG. 6B), a nitride layer 720 is disposed on the pad oxide layer 715. In a step 525 (as shown in FIG. 6C), nitride windows 832 and 830 are formed in the nitride layer 720, which may be created by using a combination of photolithography and etching in a standard CMOS process. In a step 530 (as shown in FIG. 6D), a field oxide layer 945 is disposed in the nitride window 830 and 832, where the pad oxide layer 715 and the field oxide layer 945 have the same chemical composition, which is silicon dioxide. Typically, once a nitride windows 830 and 832 are formed, the chip die is heated, and any area of the chip "die" that is not covered by the nitride layer 720 undergoes further oxidation. Additionally, because the nitride layer 720 is oxidized at a slower rate than the exposed silicon/silicon dioxide of the chip, the nitride layer 720 may be slightly "rounded." In a step 535 (as shown in FIG. 6E), the nitride layer 720 is removed. In a step 540 (as shown in FIG. 6F), a polysilicon gate 1050 is disposed over the field oxide layer 945, which may be defined through a photolithography process with a separate masking layer. In a step 545 (as shown in FIG. 6G), an n-doped regions 1160 and 1162 are implanted in the p-type substrate 610, thereby forming tunnel junctions 1165 and 1167 between the polysilicon gate 1150 and the n-doped regions 1160 and 1162. Additionally, the area for implantation is also defined through a photolithography process with a separate mask layer, and the diffusion of n-doped regions creates single-electron tunnel junctions 1165 and 1167.

Alternative for method 500, a first mask is provided for use with diffusing the n-doped region in the p-type substrate. A second mask is provided for use with disposing the polysilicon gate. A first and second single-electron tunnel junction is employed to help alleviate a mask-alignment mismatch between the first mask and the second mask.

Figure 5B:
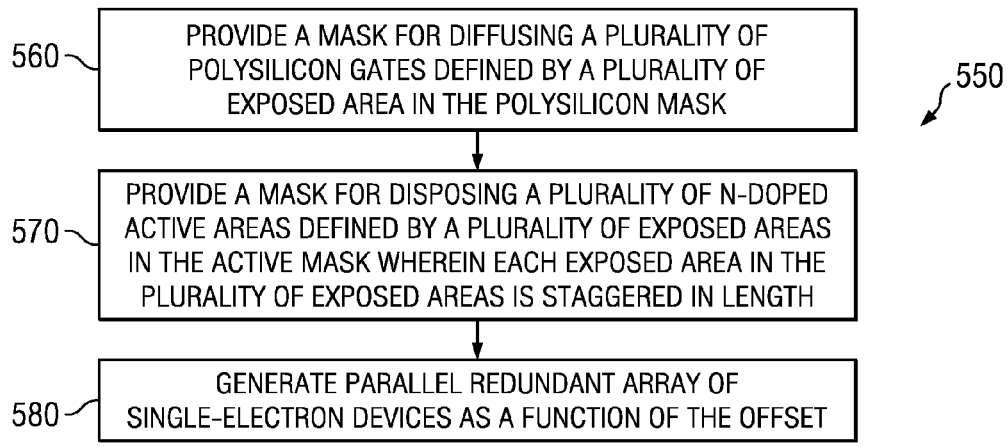
FIG. 5B illustrates a flow chart a method of manufacturing a redundant array of single-electron tunnel junctions in with CMOS processing in accordance with a preferred embodiment of the present invention.

Turning to FIG. 5B illustrates a flow chart of a method 550 of manufacturing a redundant array of single-electron tunnel junctions is shown. In a step 560, a mask is provide for diffusing a plurality of n-doped regions defined by a first set of a plurality of exposed regions of a mask. In a step 570, a mask is provided for disposing a plurality of n-doped active areas defined by a plurality of exposed areas is staggered in length. In other words, the lengths of the exposed areas of the mask are of differing lengths. In a step 580, a parallel redundant array of single-electron devices are manufactured as a function of the offsetting, such as illustrated in the method of FIG. 5A.

Figure 7:
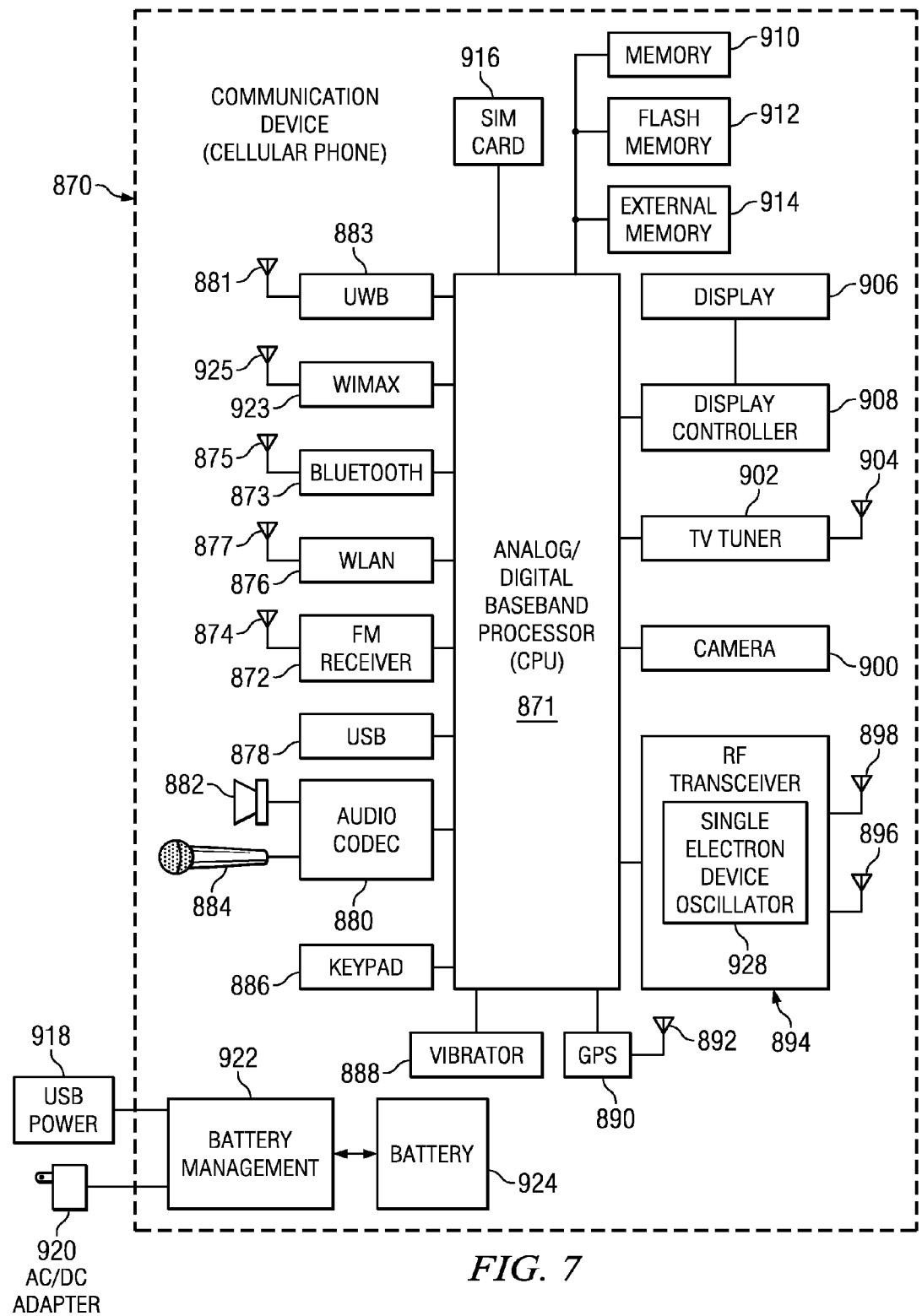
FIG. 7 illustrates simplified block diagram illustrating an example mobile communication device incorporating the single-electron device frequency oscillation and/or generation mechanism in accordance with a preferred embodiment of the present invention.

FIG. 7 illustrates a simplified block diagram illustrating an example communication device 870 incorporating the single-electron device and single-electron oscillator constructed according to the principles of the present invention. The communication device may comprise any suitable wired or wireless device such as a multimedia player, mobile station, mobile device, cellular phone, PDA, wireless personal area network (WPAN) device, Bluetooth EDR device, etc. For illustration purposes only, the communication device is shown as a cellular phone or smart phone. Note that this example is not intended to limit the scope of the invention as the SED mechanism of the present invention can be implemented in a wide variety of wireless and wired communication devices.

The cellular phone, generally referenced 870, comprises a baseband processor or CPU 871 having analog and digital portions. The basic cellular link is provided by the RF transceiver 894 and related one or more antennas 896, 898. A plurality of antennas is used to provide antenna diversity which yields improved radio performance. The cell phone also comprises internal RAM and ROM memory 910, Flash memory 912 and external memory 914.

In accordance with one aspect of the present disclosure, a single electron device 928 is employed by the RF transceiver 894. The single electron device 928 could be either internal or external to the RF transceiver 894. In some embodiments, the radio frequency device includes a plurality of single electron devices in an array, such as described in FIG. 3A, or can be dual single electron devices, such as in FIG. 2A.

Generally, the single-electron devices could be used for generation of local oscillator clocks. The single electron device could also be used to generate a stable bias current reference or voltage reference for various analog and RF circuits that comprise the radio. The current can be accurately generated by exploiting the single-electron characteristic of a Coulomb blockade in which a single-electron (i.e., charge) transfer is virtually guaranteed beyond a certain time interval, which is typically on the order of tens of picoseconds. Moving a fixed charge "e" within a well-controlled period "T" of a clock in a repetitive manner will give rise to a well-controlled current I=e/T, which could be used in as a low-noise reference current for analog and RF circuits. To increase this current, multiple single electron devices could be used. An output of the plurality of the single-electron devices is controlled to be active or inactive, such as by the multiplexer 450 of FIG. 4.

Several user interface devices include microphone 884, speaker 882 and associated audio codec 880, a keypad for entering dialing digits 886, a vibrator 888 for alerting a user, camera and related circuitry 900, a TV tuner 902 and associated antenna 104, display 106 and associated display controller 908 and GPS receiver 890 and associated antenna 892.

A USB interface connection 878 provides a serial link to a user's PC or other device. An FM receiver 872 and antenna 874 provide the user the ability to listen to FM broadcasts. WLAN radio and interface 876 and antenna 877 provide wireless connectivity when in a hot spot or within the range of an ad hoc, infrastructure or mesh based wireless LAN network. A Bluetooth EDR radio and interface 873 and antenna 875 provide Bluetooth wireless connectivity when within the range of a Bluetooth wireless network. Further, the communication device 870 may also comprise a WiMAX radio and interface 923 and antenna 925. SIM card 916 provides the interface to a user's SIM card for storing user data such as address book entries, etc. The communication device 870 also comprises an Ultra Wideband (UWB) radio and interface 883 and antenna 881. The UWB radio typically comprises an MBOA-UWB based radio.

Portable power is provided by the battery 924 coupled to battery management circuitry 922. External power is provided via USB power 918 or an AC/DC adapter 920 connected to the battery management circuitry which is operative to manage the charging and discharging of the battery 924.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

What is claimed is:

1. A method comprising:
    forming a first insulating layer on the substrate of a first conduction type, wherein the first layer is formed of a first insulating material;
    forming a second insulating layer on the first insulating layer, wherein the second insulating layer is formed of a second insulating material;
    forming a window in the second layer;
    forming a third insulating layer in the window, wherein the third insulating layer is of the first insulating material;
    forming a conductive gate over the second insulting layer; and
    implanting a dopant in the substrate to form a first region of a first conduction type and a second region of the second conduction type, wherein a first tunnel junction is formed between the first regions and the gate, and wherein a second tunnel junction is formed between the second region and the gate.

2. The method as recited in claim 1, wherein a thickness of the first insulating layer is approximately 1.2 nm.

3. The method as recited in claim 1, wherein the substrate is a p-type substrate.

4. The method as recited in claim 1, wherein the gate is formed of polysilicon.

5. The method as recited in claim 1, wherein the method further comprises providing a first mask for the step implanting of implanting the dopant.

6. The method as recited in claim 5, wherein the method further comprises providing a second mask for the step of forming the gate.

7. The method as recited in claim 6, wherein the first and second tunnel junctions are employed to help alleviate a mask-alignment mismatch between the first mask and the second mask.

8. The method as recited in claim 1, wherein the first insulating material is an oxide.

9. The method as recited in claim 1, wherein the second insulating material is a nitride.

10. The method as recited in claim 9, wherein the method further comprises etching the second insulating layer prior to the step of forming the gate.

11. An apparatus comprising:
    a substrate of a first conduction type;
    first region of a second conduction type disposed in the substrate;
    a second region of the second conduction type disposed in the substrate;
    a pad insulator disposed over at least a portion of the first region and at least a portion of the second region;
    a field insulator disposed on the substrate so as to separate the first and second regions from one another; and
    a conductive gate disposed over the field insulator and the pad insulator so as to form a first tunnel junction between the gate and the first region and to form a second tunnel junction between the gate and the second region.

12. The device as recited in claim 11, wherein the gate is formed of polysilicon.

13. The device as recited in claim 12, wherein the first conduction type is p-type and the second conduction type is n-type.

14. The apparatus as recited in claim 11, wherein the pad insulator and the field insulator are each formed of an oxide.

15. A parallel array of single-electron devices comprising:
    a first single-electron device having:

a p-type substrate,
a first n-doped region disposed in the p-type substrate,
a first pad oxide disposed over the first n-doped region,
a field oxide disposed to a side of the n-doped region and a side of the p-type substrate, and
a first polysilicon gate disposed over the field oxide and over the pad oxide;

a second single-electron device having:
a second n-doped region disposed in the p-type substrate,
a second pad oxide disposed over the second n-doped region,
a second polysilicon gate disposed over the field oxide and over the second pad oxide, at least two of the parallel single-electron tunnel devices of the redundant parallel having a differing capacitance as a function of a difference between:
a first distance measured between the first n-doped region and the first polysilicon gate, and
a second distance measured between the second n-doped region and the second polysilicon gate.

16. The parallel array as recited in claim 15, wherein a capacitance of at least one of the array of single-electron devices can store only a single electron.

17. The parallel array as recited in claim 15, wherein the array further comprises a multiplexer coupled to a plurality of single-electron devices.

18. The parallel array as recited in claim 17, wherein the multiplexer selects at least one of the plurality of the single-electron devices that has an acceptable single-electron effect.

19. The parallel array as recited in claim 18, wherein a selected single-electron device acts as a bias current reference.

20. The parallel array as recited in claim 18, wherein the acceptable single electron effect is a voltage change of 0.1 V associated with the single-electron device.

* * * * *